United States Patent
Standing et al.

(10) Patent No.: US 9,917,024 B2
(45) Date of Patent: Mar. 13, 2018

(54) ELECTRONIC COMPONENT AND METHOD FOR ELECTRICALLY COUPLING A SEMICONDUCTOR DIE TO A CONTACT PAD

(71) Applicant: Infineon Technologies Austria AG, Villach (AT)

(72) Inventors: Martin Standing, Villach (AT); Marcus Pawley, Kelsall (GB)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/210,752

(22) Filed: Jul. 14, 2016

(65) Prior Publication Data
US 2016/0322271 A1    Nov. 3, 2016

Related U.S. Application Data

(63) Continuation of application No. 14/324,642, filed on Jul. 7, 2014, now Pat. No. 9,418,925.

(51) Int. Cl.
*H01L 23/04*    (2006.01)
*H01L 21/48*    (2006.01)
(Continued)

(52) U.S. Cl.
CPC .......... *H01L 23/04* (2013.01); *H01L 21/4803* (2013.01); *H01L 21/486* (2013.01);
(Continued)

(58) Field of Classification Search
CPC ... H01L 23/04; H01L 23/498; H01L 21/4853; H01L 21/4846; H01L 21/4803;
(Continued)

(56) References Cited

U.S. PATENT DOCUMENTS 6,819,565 B2    11/2004   Kao et al.
8,062,932 B2    11/2011   Hébert et al.
(Continued)

FOREIGN PATENT DOCUMENTS

CN    102487021 A    6/2012
CN    103779312 A    5/2014

OTHER PUBLICATIONS

"Surface Mount JEDEC TO-268AA Plastic Package", Fairchild Semiconductor, TO-268AA, 2001 Fairchild Semiconductor Corporation, Rev. A, Oct. 2001, p. 1.
(Continued)

*Primary Examiner* — Thien F Tran
(74) *Attorney, Agent, or Firm* — Murphy, Bilak & Homiller, PLLC

(57) ABSTRACT

In an embodiment, an electronic component includes a dielectric core layer, one or semiconductor dies comprising a first major surface, a first electrode arranged on the first major surface and a second major surface that opposes the first major surface. One or more slots are arranged within the dielectric core layer adjacent the semiconductor die and a redistribution structure electrically couples the first electrode to a component contact pad arranged adjacent the second major surface of the semiconductor die. The semiconductor die is embedded in the dielectric core layer and a portion of the redistribution structure is arranged on side walls of the slot.

20 Claims, 10 Drawing Sheets

(51) Int. Cl.
*H01L 23/498* (2006.01)
*H01L 23/538* (2006.01)
*H01L 23/00* (2006.01)
*H01L 23/36* (2006.01)

(52) U.S. Cl.
CPC ...... *H01L 21/4846* (2013.01); *H01L 21/4853* (2013.01); *H01L 23/498* (2013.01); *H01L 23/49811* (2013.01); *H01L 23/49827* (2013.01); *H01L 23/49844* (2013.01); *H01L 23/5389* (2013.01); *H01L 24/25* (2013.01); *H01L 23/36* (2013.01); *H01L 23/5384* (2013.01); *H01L 24/06* (2013.01); *H01L 2224/04105* (2013.01); *H01L 2224/06181* (2013.01); *H01L 2224/2518* (2013.01); *H01L 2924/1305* (2013.01); *H01L 2924/13055* (2013.01); *H01L 2924/13091* (2013.01); *H01L 2924/15153* (2013.01)

(58) Field of Classification Search
CPC ........... H01L 23/49844; H01L 23/5389; H01L 24/25; H01L 21/486; H01L 23/49811; H01L 23/49827

USPC .......... 257/774, 698, 99, 700, 701, E23.067
See application file for complete search history.

(56) References Cited

U.S. PATENT DOCUMENTS

| | | | |
|---|---|---|---|
| 9,418,925 B2* | 8/2016 | Standing | ............... H01L 21/486 |
| 2004/0163843 A1 | 8/2004 | Shin et al. | |
| 2005/0136640 A1 | 6/2005 | Hu et al. | |
| 2008/0116569 A1 | 5/2008 | Huang et al. | |
| 2008/0315398 A1 | 12/2008 | Lo et al. | |
| 2010/0072588 A1 | 3/2010 | Yang | |
| 2012/0111610 A1 | 5/2012 | Kim et al. | |
| 2012/0286414 A1 | 11/2012 | Meyer-Berg | |
| 2014/0110841 A1 | 4/2014 | Beer et al. | |
| 2014/0110858 A1 | 4/2014 | Beer et al. | |

OTHER PUBLICATIONS

NXP, "Power MOSFET Selection Guide 2013—Smaller, Faster, Cooler", 2013 NXP Semiconductors N.V., Jan. 2013, pp. 1-60. http://www.nxp.com/documents/selection_guide/75017357.pdf.

* cited by examiner

ELECTRONIC COMPONENT AND METHOD FOR ELECTRICALLY COUPLING A SEMICONDUCTOR DIE TO A CONTACT PAD

BACKGROUND

An electronic component may include one or more semiconductor devices in a package. The package includes an electrically conductive redistribution structure from the semiconductor device to a substrate or a leadframe which includes outer contacts. The outer contacts are used to mount the electronic component on a redistribution board, such as a printed circuit board. The package may include a housing which covers the semiconductor device and the internal electrical connections.

SUMMARY

In an embodiment, an electronic component includes a dielectric core layer, one or semiconductor dies comprising a first major surface, a first electrode arranged on the first major surface and a second major surface that opposes the first major surface. One or more slots are arranged within the dielectric core layer adjacent the semiconductor die and a redistribution structure electrically couples the first electrode to a component contact pad arranged adjacent the second major surface of the semiconductor die. The semiconductor die is embedded in the dielectric core layer and a portion of the redistribution structure is arranged on side walls of the slot.

In an embodiment, a method includes embedding one or semiconductor die in a dielectric core layer, the semiconductor die comprising a first major surface, a first electrode arranged on the first major surface and a second major surface that opposes the first major surface, arranging a portion of a redistribution structure on side walls of one or more slots that are arranged within the dielectric core layer and adjacent the semiconductor die, and electrically coupling the first electrode to a component contact pad arranged adjacent the second major surface of the semiconductor die.

In an embodiment, an electronic component includes a means for electrically coupling a first electrode arranged on a first major surface of a semiconductor die embedded in a dielectric core layer to a component contact pad arranged adjacent a second major surface of the semiconductor die, wherein a portion of the means for electrically coupling is arranged on side walls of one or more slots arranged within the dielectric core layer and adjacent the semiconductor die.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
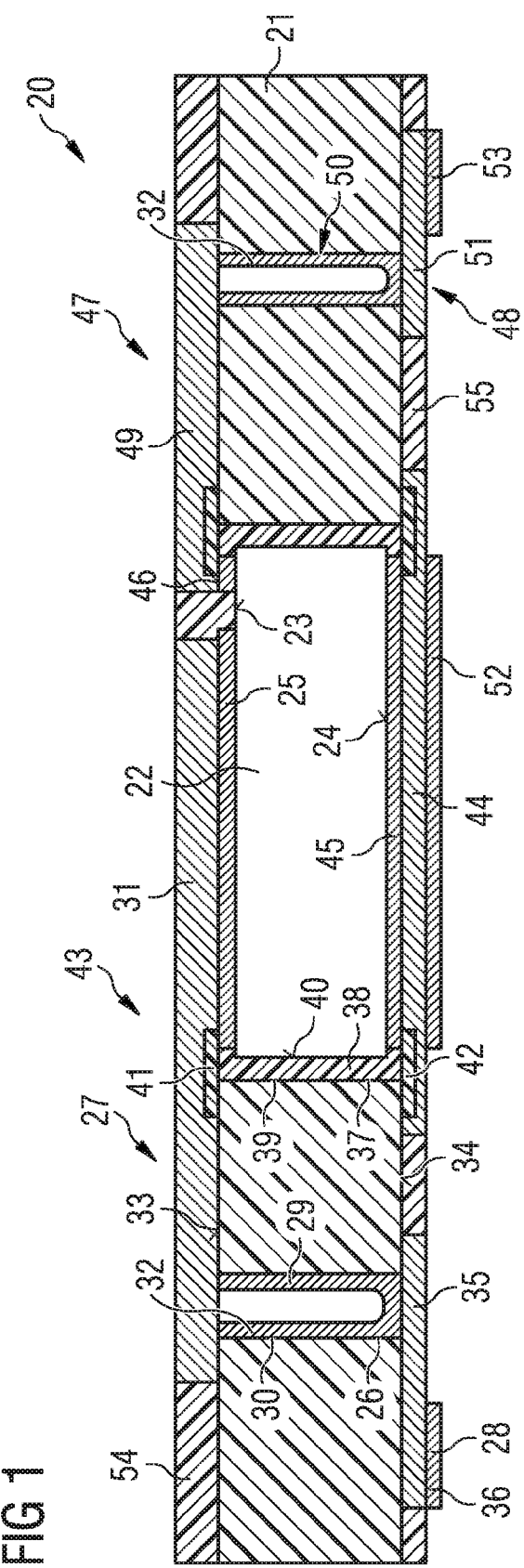
FIG. 1 illustrates a cross-sectional view of an electronic component according to a first embodiment.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims, A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As used herein, when an element is referred to as being "connected" or "electrically connected" or "coupled" or "electrically coupled" to another element, it can be directly connected or coupled to the other element or intervening elements may be present. In contrast, when an element is referred to as being "directly connected" or "directly coupled" to another element, there are no intervening elements present.

As used herein, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As used herein, a "high-voltage device," such as a high-voltage depletion-mode transistor, is an electronic device which is optimized for high-voltage switching applications. That is, when the transistor is off it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device," such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates a cross-sectional view of an electronic component 20 according to a first embodiment. The electronic component 20 includes a dielectric core layer 21 and a semiconductor die 22 including a first major surface 23 and a second major surface 24 which opposes the first major surface 23. A first electrode 25 is arranged on the first major surface 23. The semiconductor die 22 is embedded in the dielectric core layer 21. At least one slot 26 is arranged within the dielectric core layer 21 adjacent the semiconductor die 22. The electronic component 20 further includes a redistribution structure 27 which electrically couples the first electrode 25 to a first component contact pad 28 arranged adjacent the second major surface 24 of the semiconductor die 22. A portion 29 of the redistribution structure 27 is arranged on sidewalls 30 of the slot 26.

The slot 26 extends through the thickness of the dielectric core layer 21. The slot and the portion 29 of the electrically conductive redistribution structure 27 may be considered as a conductive via having a lateral area which is elongate. The slot 26 may be considered to have a length $l_s$ and a width $w_s$, whereby the length $l_s$ is at least twice the size of the width $w_s$. The slot 26 differs from a conductive via with a substantially circular cross-section by its elongate lateral area. The slot 26 may have dimensions such that $2w_s \leq l_s \leq 20w_s$.

The redistribution structure 27 may further include an electrically conductive layer 31 extending from the first electrode 25 over a first major surface 33 of the dielectric core layer 21. The portion 29 arranged on the sidewalls 30 of the slot 26 may include electrically conductive material such as a metal, for example copper. The electrically conductive material may also be in contact with the first component contact pad 28 and cover the base of the slot 26. The redistribution structure 27 provides an electrically conductive connection from the first electrode 25 arranged on the first major surface 23 of the semiconductor die 22 to the opposing side of the semiconductor die 22, since the first component contact pad 28 is arranged adjacent the second major surface 24 of the semiconductor die 22.

The first major surface 23 of the semiconductor die 22 may be substantially coplanar with the first major surface 33 of the dielectric core layer 21. The second major surface 24 of the semiconductor die 22 may be substantially coplanar with a second major surface 34 of the dielectric layer 21. In the embodiment illustrated in FIG. 1, the first component contact pad 28 is arranged on the second major surface 34 of the dielectric layer 21 and the slot 26 extends through the thickness of the dielectric core layer 21 and is substantially perpendicular to the first major surface 33 and the second major surface 34. The slot 26 may be bounded on the upper side by conductive layer 31 and on the lower side by the first component contact pad 28 or a further metallic layer 35 on which an additional component contact pad 36 is arranged.

The electronic component 20 includes an aperture 37 in which the semiconductor die 22 is secured by a layer of adhesive 38 arranged between the sidewalls 39 defining the aperture 37 and side faces 40 of the semiconductor die 22. The electronic component 20 may further include a first dielectric layer 41 arranged on the first major surface 33 of the dielectric core layer 21 in regions adjacent the aperture 37 and on peripheral regions of the semiconductor die 22. The electronic component 20 may include a second dielectric layer 42 which is arranged on the peripheral regions of the second major surface 24 of the semiconductor die 22 and covers the adhesive 38. The dielectric layers 41, 42 and the adhesive 38 together provide a substantially 1-shaped securing element 43 for securing the semiconductor die in the aperture 37.

The securing element 43 is not limited to having a substantially I-shape in cross-section and may have other forms. In some embodiments, the second major surface 24 of the semiconductor die 22 may be covered by a dielectric layer, for example an adhesive layer. This arrangement may be used for a semiconductor die for which electrical connections to the second major surface 24 are not required, for example a semiconductor die including a logic device, gate driver circuitry etc.

The semiconductor die 22 may include a vertical device such as a vertical transistor device or a vertical diode which includes at least one electrode on the first major surface 23 and on the second major surface 24.

The electronic component 20 may further include a conductive layer 44 arranged on a second electrode 45 arranged on the second major surface 24 of the semiconductor die 22. The semiconductor die 22 may further include a third electrode 46 arranged on the first major surface 23.

The first electrode may be a first current electrode which, in the case of a MOSFET device is a source electrode, the third electrode 46 may be a control electrode, which in the case a MOSFET device is a gate electrode and the second electrode 45 may be a second current electrode, which in the case of a MOSFET device, may be a drain electrode.

The redistribution structure 27 further includes a redistribution structure 47 electrically coupling the control electrode 46 to a second component contact pad 48 arranged adjacent the second major surface 24 of the semiconductor die 22 and on the second major surface 34 of the dielectric core layer 21. The redistribution structure 47 may include a conductive layer 49 extending from the control electrode 46 over the first major surface 33 of the dielectric layer 21, a conductive via 50 extending from the first major surface 33 to the second major surface 34 and a conductive layer 51 arranged on the second major surface 34 the dielectric layer 21. A component contact pad 53 may be arranged on the conductive layer 51. A second component contact pad 52 may be electrically coupled to, and arranged on, the conductive layer 44.

The electronic component 20 may further include a third dielectric layer 54 arranged on the first major surface 33 of the dielectric core layer 21 in regions between the conductive layers 31, 49. The electronic component 20 may further include a fourth dielectric layer 55 arranged on the second major surface 34 the dielectric core layer 21 in regions between the component contact pads and, in particular, between the conductive layers 35, 44 and 51.

The semiconductor die may include a switching device comprising a vertical drift path, for example a vertical power transistor such as a MOSFET device.

The semiconductor die may include a transistor device, such as a power transistor device having a vertical drift path. The power transistor device may include a MOSFET, an insulated Gate Bipolar Transistor (IGBT) or a Bipolar Junction Transistor (BJT). For MOSFET devices, the first current electrode may be a source electrode, the control electrode may be a gate electrode and the second current electrode may he a drain electrode. For IGBT devices, the first current electrode may be an emitter electrode, the control electrode may be a gate electrode and the second current electrode may be a collector electrode. For BJT devices, the first current electrode may be an emitter electrode, the control electrode may be a base electrode and the second current electrode may be a collector electrode.

In some embodiments, the electronic component includes at least one semiconductor die including a switching device comprising a vertical drift path. The switching device may be a transistor device or a diode. The electronic component is not limited to including a single semiconductor die and may also include two or more semiconductor dies, for example a transistor device, such as an IGBT and a diode, or two transistor devices.

The electronic component 20 may be considered to be a laminated electronic component which is substantially planar and has a height Which is only slightly greater than the height of the semiconductor die 22. The dielectric core layer 21 may be a prefabricated board, such as a fiber-reinforced epoxy resin, such as FR4. The dielectric core layer may have a thickness of between 25 µm and 500 µm.

The dielectric core layer 21 may include a prefabricated board, which may include a fiber reinforced matrix. For example, the dielectric core layer may include a glass fiber reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The dielectric layers 41, 42, 54, 55 may include polyimide or PEN, for example. The conductive layers may include copper.

The dielectric core layer 21 may be formed from part of a printed circuit board including a metallic foil, for example copper foil, on a first major surface 33 and/or second major surface 34. The metallic foil may be structured to produce one or more of the conductive layers or portions of the conductive layers arranged on the first major surface 33 and second major surface 34 adjacent the aperture 37 for the semiconductor die 22.

The one or more slots 26 may be arranged in the dielectric core layer 21 such that they extend substantially parallel to the side wall 39 of the aperture 37 and a side face 40 of the semiconductor die 22. The slots 26 may be bounded on one of the major surfaces by a portion of the metallic foil. Similarly, the conductive via 50 may be bounded on one side by a metallic foil. The remaining conductive layers may be applied by deposition techniques such as electroless plating or electroplating. The conductive material 32 within the slot 26 and in the conductive via 50 may be applied by electroless plating or electroplating and may be present as a layer covering the walls of the slot 26 and via 50 or may substantially fill the slot 26 and via 50.

The component contact pads 36, 52, 53 may be arranged so as to conform to a JEDEC footprint. This may be used to useful for including the electronic component 20 in circuitry designed for packages having conforming to a JEDEC standard.

The lateral form of the slot 26 enables current flowing form the first electrode 25 to the first component contact pad 28 to be carried over a larger area due to the elongated shape of the slot 26 compared to a via having a substantially circular or square lateral shape. This decreases the resistance and assists in reducing unwanted capacitances and improving heat distribution and heat dissipation.

The electronic component 20 illustrated in FIG. 1 includes a single semiconductor die 22. However, the electronic component 20 may include two or more semiconductor dice which may be electrically coupled to provide a desired circuit. For example, the electronic component may include two transistor devices configured to provide a half-bridge circuit, two transistor devices configured as a half bridge circuit and a further logic device such as a gate driver circuit, a transistor device and a free-wheeling diode, four transistors configured to provide a full bridge circuit etc.

Figure 2:
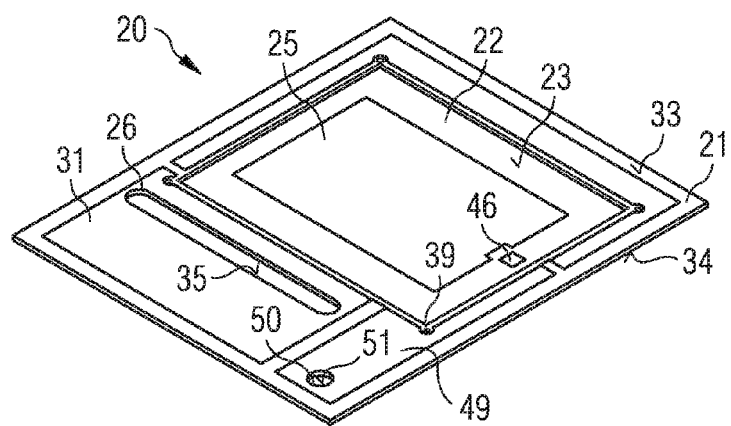
FIG. 2 illustrates a partial cutaway perspective view of the electronic component according to the first embodiment.

FIG. 2 illustrates a perspective partially cutaway view of the electronic component 20 according to the first embodiment. FIG. 2 illustrates the first major surface 33 of the dielectric core layer 21 including the aperture 37 which extends form the first major surface 33 to the second major surface 34 of the dielectric core layer. As can be seen in the perspective view, the aperture 37 is substantially rectangular. The semiconductor die 22 is inserted in the aperture 37 with the second current electrode facing downwards and the first current electrode 25 and the third electrode 46 facing upwardly. In this particular embodiment, the third electrode 46 is arranged in an edge region of the short side of the substantially rectangular semiconductor die 22 and approximately in the centre of the edge region. The first electrode 25 is much larger than the third electrode 46 substantially covers the first major surface 23 of the semiconductor die 22.

The electronic component 20 includes a single slot 26 which extends form the upper surface 33 of the dielectric core layer 21 through the core layer 21 and is bounded on its lower side by a portion of a metallic foil 28. The slot 26 has a length which extends in a direction which is substantially parallel to the long side face of the aperture 37 and has an elongate lateral area. The via 50 is positioned in a corner region of the dielectric core layer 21 adjacent one end of the slot 26.

The slot 26 is illustrated as having semicircular ends in plan view. These may be formed by the shape of a drillbit used to drill the slot in the dielectric core layer 21. However, the slot 26 is not limited to this particular lateral shape and may have curved ends or rectangular ends. The via 50 has a substantially circular lateral area which may be formed by use of a circular drillbit. The aperture 37 also includes semicircular corner portions which may be a result of use of a circular drillbit for forming the aperture 37 in the dielectric core layer 21. The aperture 37 may have other lateral forms without the circular corner portions. The slot 26, the via 50 and the aperture 37 may also be produced in the dielectric core layer 21 by other methods, including laser ablation, for example.

Portions of the redistribution structures 27, 47 may be formed by patterning a metallic foil which is adhered to the first major surface 33 or second major surface 34 of the dielectric core layer 21.

Figure 3:
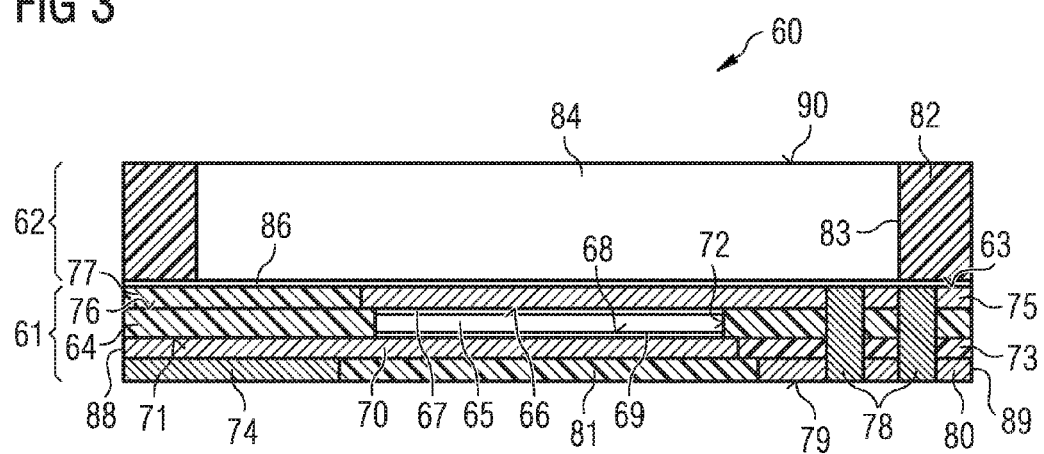
FIG. 3 illustrates a cross-sectional view of an electronic component according to a second embodiment.

FIG. 3 illustrates a cross-sectional view of an electronic component 60 according to a second embodiment.

The electronic component 60 includes an active component portion 61 and a heat dissipation portion 62 which is arranged on a first major surface 63 of the active component portion 61. The active component portion 61 has a multilayer laminate structure and is substantially planar with a width and a breadth which is much greater than its height.

The active component portion 61 includes a dielectric core layer 64 and a semiconductor die 65 including a vertical power transistor device which is embedded in the dielectric core layer 64. The semiconductor die 65 has a thickness which is substantially equal to the thickness of the dielectric core layer 64 in this embodiment. However, the semiconductor die 65 may also have a thickness which is greater than or equal to the thickness of the dielectric core layer 64.

The dielectric core layer 64 may include a prefabricated board, for example a fiber reinforced epoxy resin board, such as FR4. The semiconductor die 65 may be embedded in the dielectric core layer 64 by forming an aperture in the dielectric core layer 64, inserting the semiconductor die 65 into the aperture and securing the semiconductor die 65 in the aperture by means of adhesive inserted into the peripheral regions of the aperture between the semiconductor die 65 and the dielectric core layer 64.

The semiconductor die 65 may include a vertical power transistor device such as a power MOSFET. The semiconductor die 65 includes a first major surface 66 which includes a first current electrode 67, for example a source electrode, and a control electrode, for example a gate electrode, which cannot be seen in the cross-sectional view of FIG. 3. The semiconductor die 65 further includes a second major surface 68 including a second current electrode 69, for example a drain electrode.

The active component portion 61 includes a first conductive layer 70 arranged on the second current electrode 69 which extends over the second major surface 68 of the semiconductor die 65 and a second major surface 71 of the dielectric core layer 64. The first conductive layer 70 may extend on a region of the second major surface 71 which is positioned adjacent a side face 72 of the semiconductor die 65. The remaining regions of the second major surface 71 of the dielectric core layer 64 are covered by a first dielectric layer 73.

A second conductive layer 74 is positioned on a peripheral region of the conductive layer 70 such that it is positioned adjacent, and peripheral to, the semiconductor die 65. The second conductive layer 74 provides an outer contact of the electronic component 60 and, in particular, an outer contact that is electrically coupled to the second current electrode 69.

The active component portion 61 includes a third conductive layer 75 which is arranged on the first major surface 66 of the semiconductor die 65 and extends onto regions of the second major surface 76 of the dielectric core layer 64 that are peripheral to at least one side face of the semiconductor die 65. In this embodiment, the third conductive layer 75 extends over a peripheral region that opposes the peripheral region on which the first conductive layer 70 is arranged.

The active component portion 61 further includes a second dielectric layer 77 arranged on the remaining portions of the second major surface 76 of the dielectric core layer 64 to provide a substantially planar first major surface 63 for the active component portion 61.

The active component portion 61 further includes one or more conductive vias 78 which extend from the third conductive layer 75 through the dielectric core layer 64 to the second major surface 79 providing the lower surface of the active component portion 61. The conductive vias 78 are electrically coupled to a fourth conductive layer 80 which provides an outer contact pad for the first current electrode and the control electrode.

The conductive vias 78 include a slot having a length which is at least twice as large as the width and include conductive material covering at least side walls of the slot. The length of each of the slots extends in a direction substantially parallel to the side face of the semiconductor die. The use of two or more substantially parallel slots for the conductive vias enables the current to be distributed in parallel through the dielectric core layer from the upper surface to the lower surface.

The outer contact pad for the control electrode cannot be seen in the cross-sectional view of FIG. 3. The fourth conductive layer 80 is arranged adjacent and peripheral to the semiconductor die 65. The regions between the outer contact 74 and the outer contact 80 are filled with a third dielectric layer 81. The outer contacts 74, 80 may be substantially coplanar with the dielectric layer 81 or may protrude from the dielectric layer 81.

The electronic component 60 may be considered to include an active component portion 61 which is substantially planar and has a laminated structure and heat dissipation portion 62 which includes the dissipation layer 84. The heat dissipation portion 62 is substantially planar in this embodiment.

The heat dissipation layer 84 is thermally coupled to the semiconductor die 65 and includes a material having a substantially isotropic thermal conductivity. The heat dissipation layer 84 may include a metal, such as copper or aluminium, or an alloy, such as a copper alloy or an aluminium alloy, for example.

The heat dissipation portion 62 may have a thickness $t_h$ which is between 3 to 10 times the thickness $t_a$ of the active component portion 61, i.e. $3t_a \leq t_h \leq 10t_a$. The dielectric core layer 64 may have a thickness of between 25 μm and 500 μm. The semiconductor die 65 may have a thickness of between 25 μm and 550 μm. The active component portion 61 may have a thickness $t_a$ of between 45 μm and 1000 μm. The heat dissipation portion 62 may have a thickness $t_h$ of between 100 μm and 10 mm.

The heat dissipation portion 62 of the electronic component 60 includes a second dielectric core layer 82 which may include a prefabricated board, for example a glass fiber reinforced epoxy resin board such as FR4. The second dielectric core layer 82 includes an aperture 83 in which the heat dissipating layer 84 is arranged. The heat dissipating layer 84 may be secured in the aperture 83 of the second dielectric core layer 82 by the a layer of adhesive positioned at the periphery of the aperture 83 between the side faces of the heat dissipation layer 84 and the wall defining the aperture 83 in the second dielectric core layer 82.

The heat dissipation portion 62 may be mounted on the active component portion 61 by a layer of adhesive 86. The adhesive 86 may be electrically insulating in order to electrically insulate the metal heat dissipation layer 84 from the underlying first current electrode. In other embodiments, the adhesive layer 86 may be conductive so as to electrically couple the heat dissipation layer 84 to the first current electrode 67. If the first current electrode 67 is a source electrode, the electrically conductive layer may be used to couple the heat dissipation layer 84 to ground potential.

The second dielectric core layer 82 provides a closed peripheral frame around a central heat dissipation layer 84. The upper surface of the heat dissipation layer 84 is exposed in the upper surface 90 of the electronic component 60. The area of the heat dissipation portion 62 corresponds to the area of the active component portion 61. The active component portion 61 and the heat dissipation portion 62 each have a substantially planar form.

The outer contact 80 electrically coupled to the first current electrode 67, the outer contact 74 electrically coupled to the second current electrode 69 and an outer contact electrically coupled to the control electrode are positioned adjacent the semiconductor die 65 such that they do not cover the semiconductor die 65. The outer contact electrically coupled to the control electrode cannot be seen in the cross-sectional view of FIG. 3.

In this particular embodiment, a single outer contact pad 74 is provided for the second current electrode which extends over the substantially the entire edge region 88 of the second major surface 79 of the active component portion 61. However, other arrangements of the outer contact 74 may also be used, for example, two or more outer contacts may be provided which are electrically coupled by a further conductive layer positioned within the electronic component 61, for example by the first conductive layer 70.

The outer contact 80 coupled to the first current electrode 67 has a larger lateral area than the outer contact coupled to the control electrode In this particular embodiment, the outer contact 80 coupled to the first current electrode 67 and the outer contact coupled to the control electrode are positioned on the opposing peripheral edge region 89 of the active component portion 61 to the peripheral edge region 88 including the outer contact 74. However, other arrangements may be used in which the outer contacts are arranged on one, three or four peripheral regions to the semiconductor die 65.

The heat dissipation layer 84 is thermally coupled to the semiconductor die 65 since it is arranged on top of the semiconductor die 65 and is separated from the semiconductor die 65 by only a thin adhesive layer 86 and the third conductive layer 75. The arrangement of the outer contacts 74, 80 peripheral to side faces of the semiconductor die 65 and the provision of a thin first metal layer 70 on the second current electrode 69 encourages heat to be dissipated through the heat dissipation layer 84 and discourages heat to be dissipated in the opposing direction, for example through the outer contacts 74, 80.

The arrangement of the outer contacts 74, 80 peripheral to the side faces of the semiconductor die 65 may be used to provide an electronic component 60 with improved top side cooling and reduced heat dissipation into circuit board on which the outer contacts 74, 80 are mounted.

Figure 4:
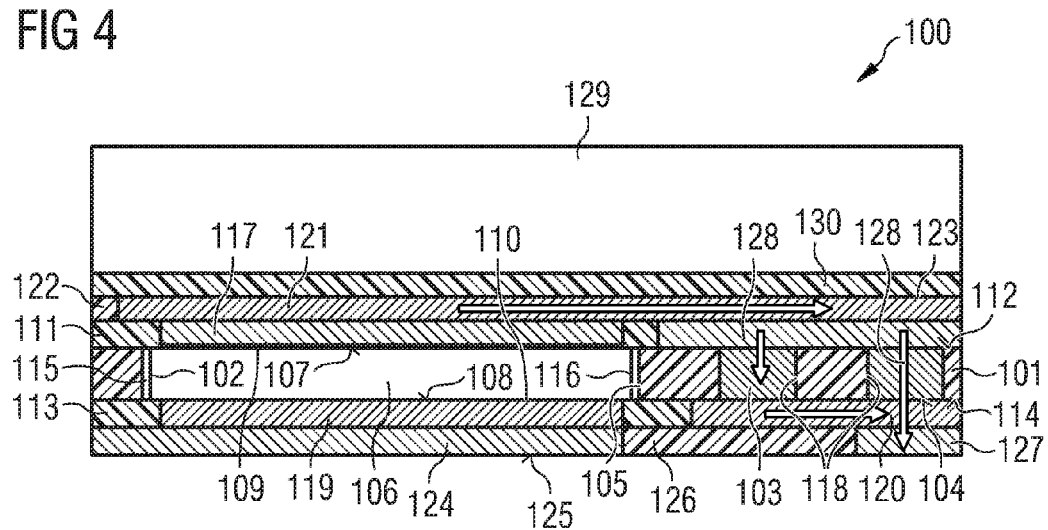
FIG. 4 illustrates a cross-sectional view of an electronic component according to a third embodiment

FIG. 4 illustrates a cross-sectional view of an electronic component 100 according to a third embodiment. The electronic component 100 has a multilayer laminate structure including a dielectric core layer 101 which includes an aperture 102 for accommodating at least one semiconductor die and two slots 103, 104 which are arranged adjacent the aperture 102 and which extend substantially parallel to the side wall 105 defining the aperture 102. The aperture 102 and the slots 103, 104 extend through the thickness of the dielectric core layer 101.

The electronic component 100 includes a semiconductor die 106 arranged in the aperture 102 such that it is embedded in the dielectric core layer 101. The semiconductor die 106 includes a first major surface 107 and the second major surface 108 which opposes the first major surface 107.

The semiconductor die may include a vertical device such as a vertical transistor device which has electrodes of the two opposing major surfaces. A first electrode 109, which is a first current electrode, is arranged on the first major surface 107. A second electrode 110, which is a second current electrode, is arranged on the second major surface 108. A third electrode, which is a control electrode, is also arranged on the first major surface 107 of the semiconductor die 106 but cannot be seen in the cross-sectional view of FIG. 4.

The electronic component 100 further includes a first dielectric layer 111 which is arranged at the interface between the first major surface 107 of the semiconductor die 106 and a first major surface 112 of the dielectric core layer 101. A second dielectric layer 113 is arranged on the interface between the second major surface 108 of the semiconductor die 106 and second major surface 114 of the dielectric core layer 101. The first dielectric layer 111 and the second dielectric layer 113 may each have a ring-shape that extends around the periphery of the semiconductor die and the aperture. The dielectric layers 111, 113 may be used in conjunction with the adhesive 115 which is arranged between the side face 116 of the semiconductor die 106 and the side face 105 of the aperture 102 to secure the semiconductor die 106 in the aperture 102.

The electronic component 100 includes a first conductive layer 117 which is arranged on the first electrode 107, on the first major surface 112 of the dielectric core layer 101 and on at least sidewalls 118 defining the slots 103, 104. The thickness of the first conductive layer 117 may be substantially the same as the thickness of the first dielectric layer 111. A second conductive layer 119 is arranged on the second major surface 108 of the semiconductor die 106 and the second major surface 114 of the dielectric layer 101. A portion 120 of the first second conductive layer 109 covers the base of the slots 103, 104. The thickness of the conductive layers 119, 120 is substantially the same as the thickness of the second dielectric layer 113.

A third conductive layer 121 is arranged on the first conductive layer 117 and on the first dielectric layer 111. A third dielectric layer 122 is arranged on regions of the first dielectric layer 111 and on the first conductive layer 117 in order to planarise the upper surface 123 of the electronic component 100.

A fourth conductive layer 124 is arranged on the second conductive layer 119 and the second dielectric layer 113 to form contact pads for the electronic component 100 on the lower surface 125 of the electronic component 100. A fourth dielectric layer 126 is arranged between regions of the fourth conductive layer 124 which provide the outer contacts.

The slots 103, 104 provide conductive vias having an elongated lateral shape and form part of the redistribution structure between the first electrode 109 and an outer contact area 127. The arrangement of the slots 103, 104 adjacent the side face 116 of the semiconductor die 106 enables current to be carried over larger parallel conductive vias in comparison to the use of the single conductive via or two smaller circular conductive fires provides with the smaller lateral area.

The lateral area of the slot or slots with respect to the lateral area of the contact pad may also be configured to reduce the resistance of the redistribution structure. For example, the slot may have a length $l_s$ and the component contact pad may have a length $l_p$ and $0.9\ l_p \leq l_s \leq 0.99\ l_p$. The slot may have an area as and the contact pad may have an area $a_p$ and $0.1\ a_p \leq a_s \leq 0.2\ a_p$.

In the embodiment illustrated in FIG. 4, the outer contact area 127 is arranged in the periphery of the lower surface 125 of the electronic component 100. The portion 120 of the conductive layer 119 provides a lateral redistribution form the first slot 103 to the outer contact 127.

The distribution of the current laterally in the conductive layers 120 and 121 and through the slots 103, 104 is indicated in FIG. 4 by the arrows 128.

The electronic component 100 may also be used in conjunction with a heat dissipation layer 129 which is attached to the upper surface 123 by an adhesive layer 130. The side faces and/or edge regions of the upper surface of the heat dissipation layer may include an electrically insulating layer. The heat dissipation layer 129 may be embedded in a second dielectric core layer.

Portions of the first conductive layer 117 and/or the second conductive layer 119 may be provided by portions of a metallic foil which is adhered to the first major surface 112 of the second major surface 114, respectively, before the aperture 102 and the slots 103, 104 are formed on the dielectric core layer 101.

For example, the portion 120 of the first dielectric layer 119 may be provided by a metallic foil and the slots 103, 104 inserted into the dielectric core layer 101 from the first major surface 112 down to the interface between the second major surface 114 of the dielectric layer 101 and the metal foil 120. The remaining portions of the second conductive layer 119 may be provided by depositing conductive material onto the second major surface 108 of the semiconductor die 106 and further regions of the second major surface 114 of the dielectric layer 101 in order to provide the desired lateral shape and thickness for the second conductive layer 119.

A method for fabricating an electronic component including a semiconductor die embedded in a dielectric core layer and a redistribution structure including one or more slot-shaped conductive vias will now be explained with reference to FIGS. 5 to 10. In the drawings, the method is explained is illustrated by a single electronic component assembly. However, the method may be carried out for large board including a plurality of component positions, each corresponding to the assembly illustrated in the drawings. The individual electronic components may be singulated from the board, for example by sawing.

Figure 5A:
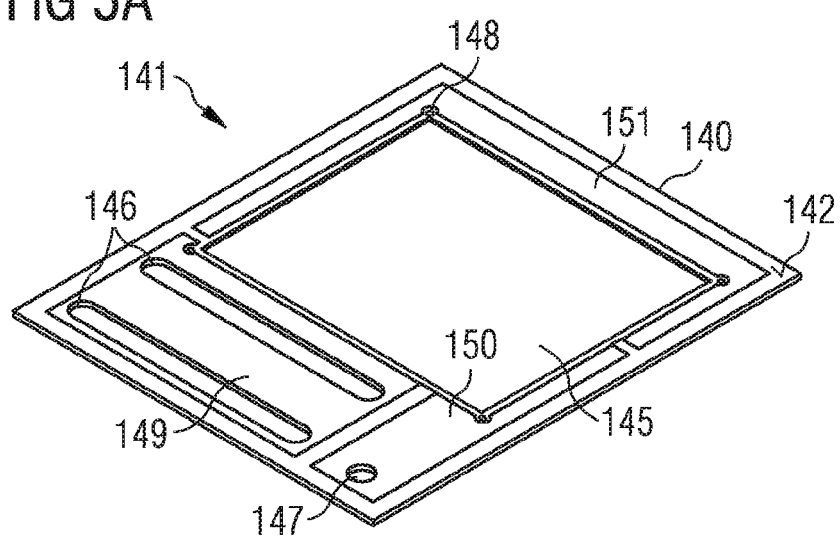
FIG. 5a illustrates a perspective view of the upper surface of a dielectric core layer.
Figure 5B:
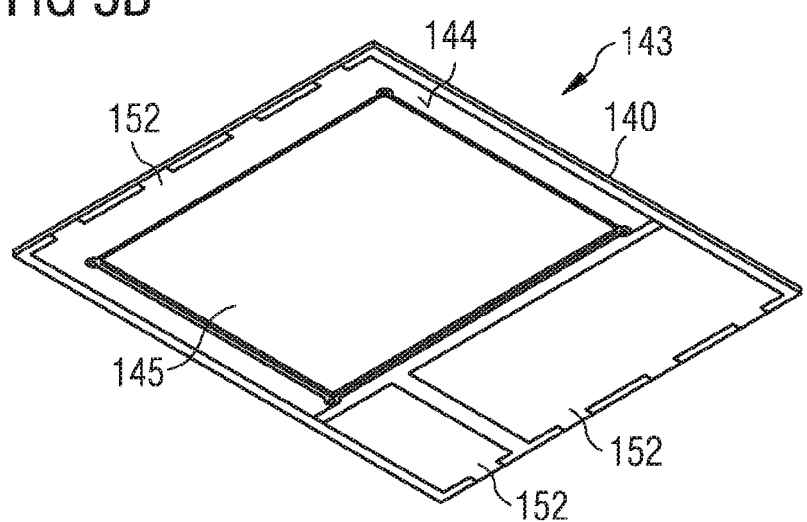
FIG. 5b illustrates a perspective view of the lower surface of the dielectric core layer.

FIG. 5a illustrates a perspective view of the upper surface and FIG. 5b illustrates a perspective view of the lower surface of a dielectric core layer 140.

A dielectric core layer 140 is provided that includes a first metallic foil 141 arranged on the upper surface 142 and a second metallic foil 143 on the lower surface 144. An aperture 145 is introduced from the upper surface 142 which extends form the upper surface 142 to the lower surface 144 of the dielectric core layer 140 such that the aperture 145 is open on both sides. The aperture 145 is substantially rectangular and has a lateral area suitable for accommodating a semiconductor die.

Two slots 146 are inserted into the dielectric core layer 140 adjacent the aperture 145 from the upper surface 142. The slots 146 are bounded on the lower surface 144 by a portion of the second metallic foil 143. The slots 146 each have a length which extends in a direction which is substantially parallel to the long side face of the aperture 145. Each slot 146 has an elongate lateral area. A via 147 is inserted in a corner region of the dielectric core layer 140. The via 147 has a substantially circular lateral form and has a lateral area which is less than the lateral area of each of the slots 146. The via 147 is bounded on the lower surface 144 by a portion of the second metallic foil 143.

Two slots 146 are illustrated FIGS. 5 to 10. However, the number of slots is not limited to two and may be one or three or more slots. The slots 146 are substantially parallel to the side face of the aperture 145. However, the position of the slots is not limited to this arrangement. For example, the slots may be arranged perpendicularly to the side face of the aperture, may be inclined with respect to the side face of the aperture, for example. The slots may extend at an angle of substantially 90° or less than 90° to the upper surface 142 or lower surface 144 of the dielectric core layer 140.

The slots 146 are illustrated as having substantially semicircular ends. These may be formed by the form of a drill bit used to drill the slots 146 in the dielectric core layer 140. However, the slots 146 are not limited to this particular actual shape and may have curved ends or rectangular ends. The via 147 has a substantially circular lateral area formed by use of a circular drill bit.

The aperture 145 also includes circular corner portions 148 are a result of use of a circular drill bit for forming the aperture 145 in the dielectric core layer 140. The aperture 145 may have other lateral forms without the circular corner portions. The slots 146, via 147 and aperture 145 may also be produced in the dielectric core layer 145 by other methods, such as laser ablation, for example.

The first metallic foil 141 arranged on the upper surface 142 of the dielectric layer is structured such that a portion 149 is arranged adjacent the aperture 145 and surrounds the slots 146. A further portion 150 surrounds the via 147 and extends around a corner region of the aperture 145 and along short side of the aperture 145. The aperture 145 is bounded on remaining three sides by a further portion 151 of the first metallic layer 141. The portions 149, 150, 151 of the first metallic layer 141 are electrically insulated from one another by intervening portions of the dielectric core layer 140.

The second metallic foil 143 positioned on the lower surface 144 of the dielectric layer 140 may be patterned or structured to provide outer contact pads 152 for the electronic component or a first layer for receiving outer contacts pads. The arrangement of the outer contact pads 152 may conform to a JEDEC package outline, for example a Super SO8 package outline.

The starter sheet providing the dielectric core layer 140 may processed significantly before the semiconductor die is placed in the sheet to avoid possible damage to the semiconductor die.

The material used for the starter sheet may be FR4 material. It consists of a glass reinforced epoxy centre core with copper bonded to both sides. The centre core can be varied and may use materials such as PTFE (Polytetrafluoroethylene), PEN (Polyethylene Naphthalate), PET (Polyethylene Terephthalate), Polyimide, BT laminate (Bismaleimide-Triazine) etc. The material may be with reinforcement or not and thickness can vary from perhaps 25-500 μm.

The large aperture 145 for the semiconductor die may be punched, mechanically milled or cut with water jet, for example. Laser ablation technologies may also be used to structure the starter sheet. The metallic foil, for example copper, may be used as a hard mask for the laser ablating process. In this case the metallic foil may be etched away from the areas that require ablation.

The metallic foil may be removed from both the top and the bottom surfaces in areas where a through hole is required, for example for aperture 145 for the semiconductor die. Where a through connection is required, for example the two slots 146 and via 147, the metallic foil may be removed only from one side to produce a blind slot or blind via. During later plating stages the top and bottom metallic layers can be joined through this blind via. In the case of using laser ablation, a second etch process may be carried out in which the metal on the lower side of the double sided laminate material has been patterned to form basic circuit elements.

Figure 6A:
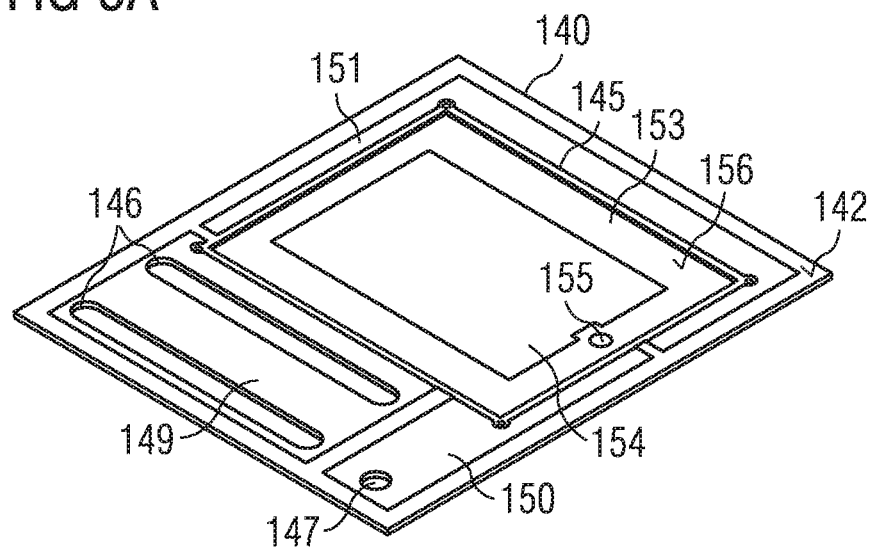
FIG. 6a illustrates a perspective view of a semiconductor die embedded in the dielectric core layer.
Figure 6B:
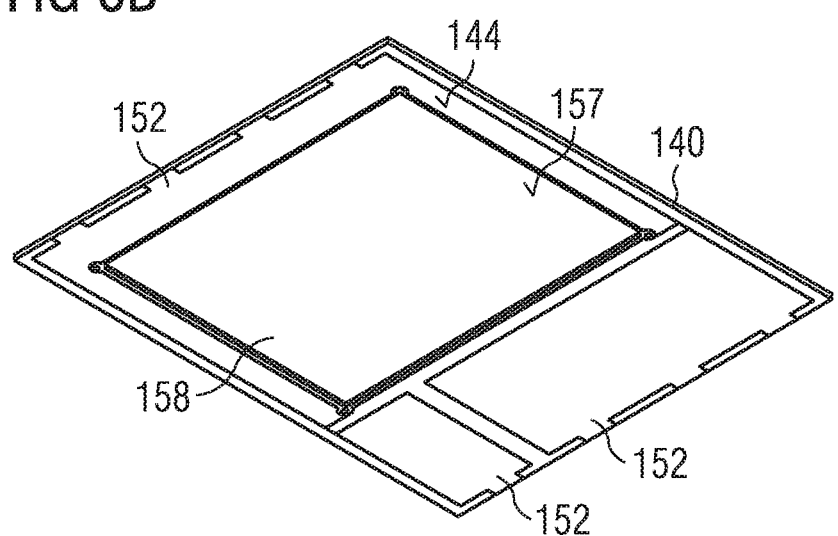
FIG. 6b illustrates a perspective view of the lower surface of the dielectric core layer including the semiconductor die.

FIG. 6*a* illustrates a top perspective view and FIG. 6*b* illustrates a bottom perspective view of a semiconductor die 153 embedded in the dielectric core layer 140.

The semiconductor die 153 includes a first current electrode 154 and a control electrode 155 on a first major surface 156 and a second current electrode 157 on a second major surface 158. The semiconductor die 153 is inserted in the aperture 145 with the second current electrode 157 facing downwards and the first current electrode 154 and control electrode 155 faces upwards. In other embodiments, the semiconductor die 153 is inserted in the aperture 145 with the second current electrode 157 facing upwards and the first current electrode 154 and control electrode 155 faces downwards.

In this particular embodiment, the control electrode 155 is arranged in an edge region of the short side of the substantially rectangular semiconductor die 153 and in approximately the centre of the edge region. The first current electrode 154 is larger and substantially covers the remainder of the first major surface 156 of the semiconductor die 153. The first major surface 156 is substantially coplanar with the upper surface 142 of the dielectric core layer 140. The second major surface 158 is substantially coplanar with the lower surface 144 of the dielectric core layer 140.

Figure 7A:
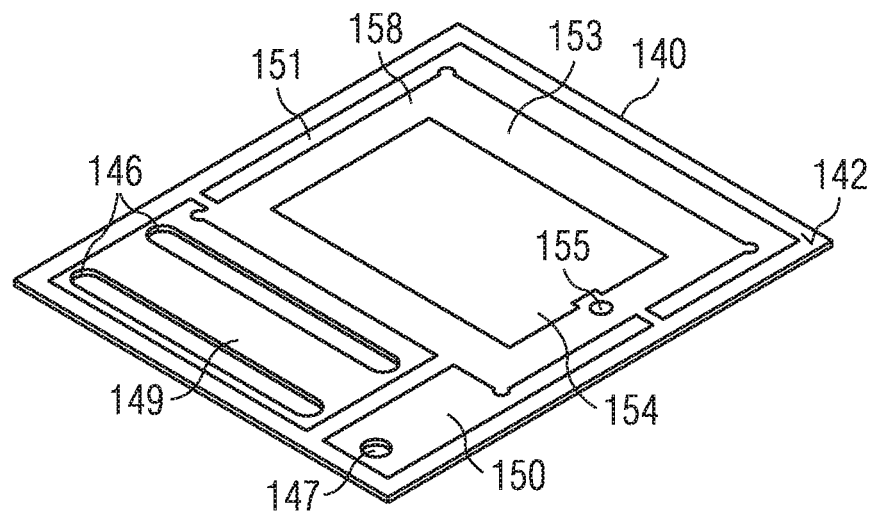
FIG. 7a illustrates a perspective view of a first dielectric layer arranged on the upper surface of the dielectric core layer.
Figure 7B:
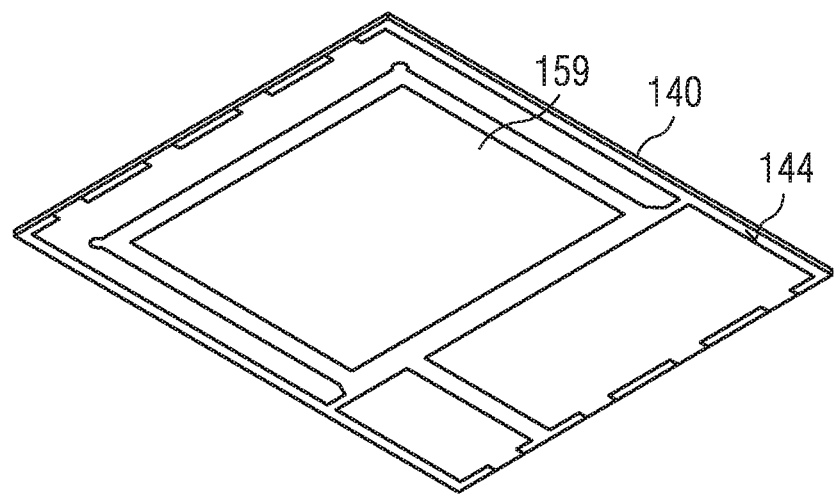
FIG. 7b illustrates a perspective view of a first dielectric layer arranged on the lower surface of the dielectric core layer.

FIG. 7*a* illustrates a perspective view of the dielectric core layer 140 after the deposition of a first dielectric layer 158 on the upper surface 142 of the dielectric core layer 140 and FIG. 7*b* illustrates a perspective view of a second dielectric layer 159 on the lower surface 144 of the dielectric core layer 140.

The first dielectric layer 158 is arranged on the peripheral regions of the first major surface 156 semiconductor die 154 and of the aperture 145. The second dielectric layer 159 is arranged peripheral regions of the second major surface 144 of the semiconductor die 154 and on portions of the lower surface 144 adjacent the aperture 145.

The first dielectric layer 158 and second dielectric layer 159 and if present, adhesive arranged between the side faces of the semiconductor die 154 and the side faces of the aperture 145 serve to secure the semiconductor die 154 in the aperture 145.

A photo-sensitive dielectric material may be used to hold the die in place and mask the respective layers. The dielectric material can be deposited using numerous methods, such as screen-printing, spraying, curtain coating, dipping etc. The material may also be used to fill the track gaps in the copper, which may assist in keeping the structure relatively flat and co-planar for the subsequent processes and may improve the electrical insulation between tracks in the finished assembly.

The material is applied on one surface and processed through exposure, developing and final cure or partial cure. The exposure process can be carried out using any of the available processing methods, contact masks, proximity aligners (collimated light sources or LDI (Laser Direct imaging) etc. The laser direct imaging may be used to achieve high the general accuracy and high accuracy between layer stages.

The developing of these materials may be based on an aqueous process based on very weak calcium carbonate or potassium hydroxide solutions. However, solvent based development may also be used.

The final cure may be taken to completion or may consist of a partial cure. A balance may be considered between obtaining enough curing to retain the die during the removal from the adhesive film and the benefit from co-polymerization with the subsequent dielectric applied to the other side of the sheet. The process requires approximately 150° C. for approximately 1 hour to obtain a good cure level. If a thermal release sheet is chosen with a slightly higher value, for example 160-175° C., then the separation of the sheet from the adhesive carrier sheet can be incorporated in the cure cycle by raising the temperature at the end of the cure cycle.

The sheet is then removed from the adhesive sheet and the dielectric material is deposited on the reverse side. In most cases it is not necessary to remount the panel to a carrier sheet, but in cases where the material is very fragile the processed side can be mounted to a carrier sheet. The second side is processed in exactly the same manner as the first side. The advantage of not fully completing a cure on the first side deposition is that the second deposition will have an opportunity to co-polymerize to some degree where it meets the material of the first deposition around the die edge.

Figure 8A:
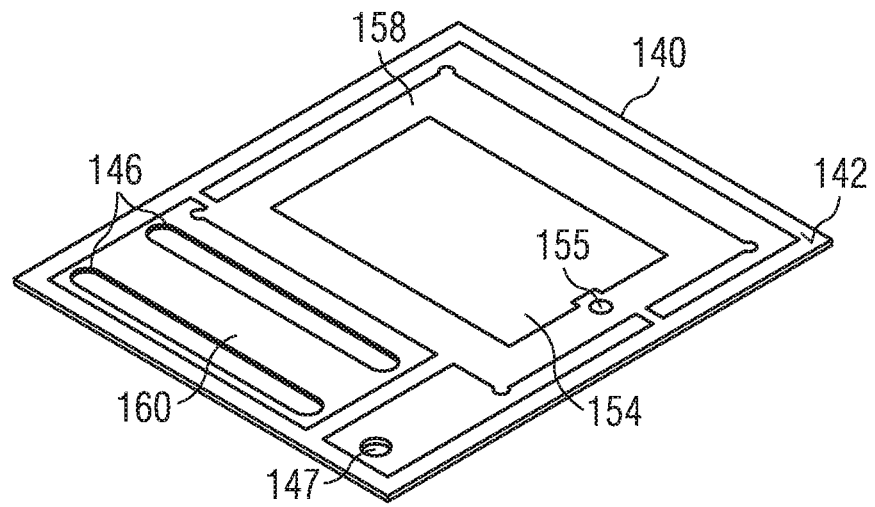
FIG. 8a illustrates a perspective view of a first conductive deposited layer arranged on the upper surface of the dielectric core layer.
Figure 8B:
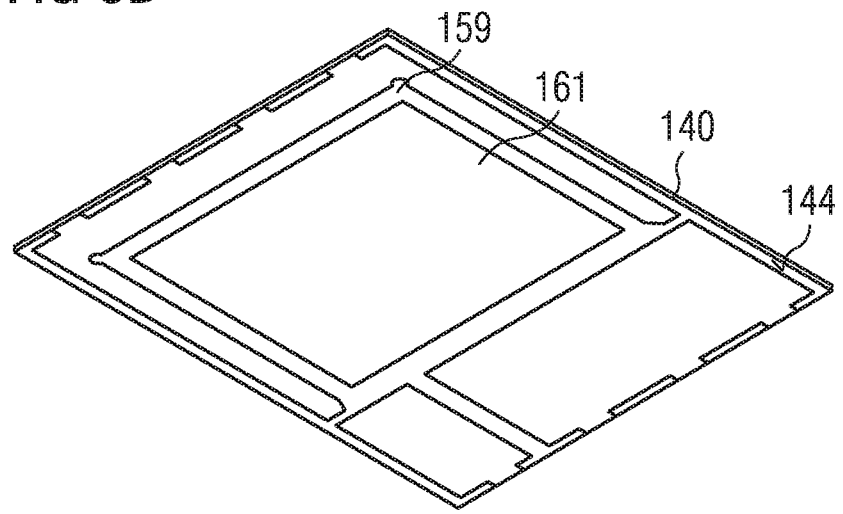
FIG. 8b illustrates a perspective view of a first conductive layer arranged on the lower surface of the dielectric core layer.

FIG. 8*a* illustrates a perspective view of the dielectric core layer 140 after the deposition of a first conductive layer 160 on the upper surface 142 of the dielectric core layer 140 and FIG. 8*b* illustrates a perspective view a second conductive layer 161 on the lower surface 144 of the dielectric core layer 140.

The first conductive layer 160 is arranged in regions of the first major surface 156 of semiconductor die 154 and on regions of the upper surface 142 of the dielectric core layer 140 between portions of the first dielectric layer 158. The first conductive layer 160 is also arranged on the sidewalls of the slots 146 and sidewalls of the via 147. The second conductive layer 161 is arranged in regions of the second major surface 157 of the semiconductor die 154 and on portions of the lower surface 144 between portions of the second conductive layer 161. The conductive layers 160, 161 may include copper that has been deposited using an electroplating process.

This first copper deposition may be used planarise the recessed areas with respect to the surrounding foil portion and dielectric surfaces. However, the area of the semiconductor die surface may stand slightly higher than the surrounding areas to assist in providing a good thermal coupling to the die when bonding the heat-sink or heat-spreader to the assembly. The areas of the through connections, such as the slots 146 and via 147, receive the first plating layer. Whilst the slots 146 and via 147 are much deeper than the height difference between the dielectric layer and the semiconductor die and cannot be completely planarised, it helps to improve the planarity and also helps to reduce the electrical resistance.

Figure 9A:
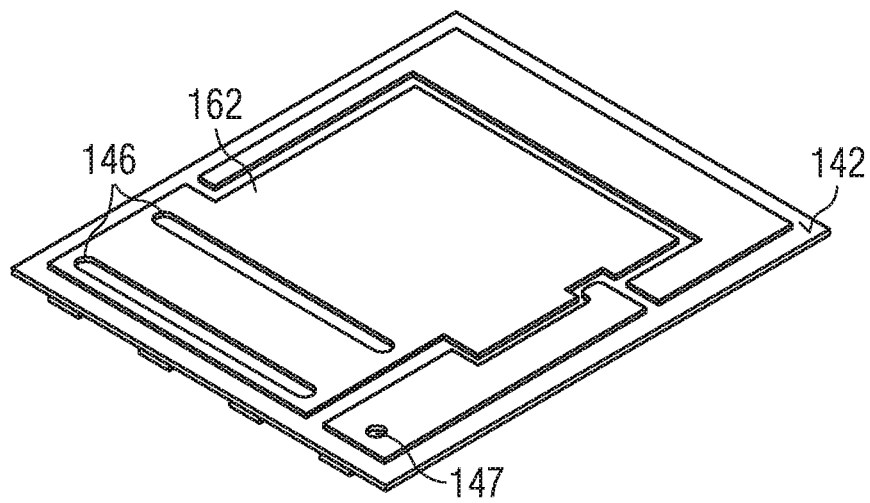
FIG. 9a illustrates a perspective view of a second conductive layer arranged on the upper surface of the dielectric core layer.
Figure 9B:
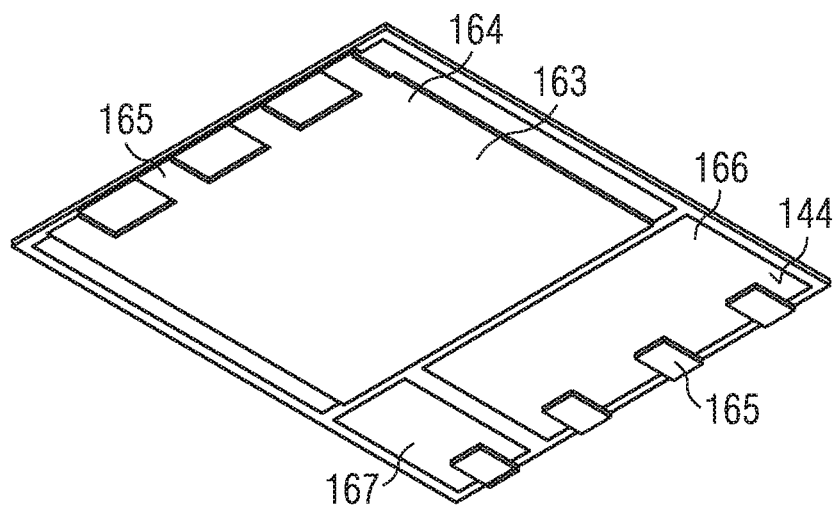
FIG. 9b illustrates a perspective view of a second conductive layer arranged on the lower surface of the dielectric core layer.

FIG. 9a illustrates a second conductive layer 162 arranged on the upper surface 142 of the dielectric core layer 140 and FIG. 9b illustrates a second conductive layer 163 arranged on the lower surface 144 of the dielectric core layer 140.

The second conductive layer 162 is deposited over the first conductive layer 160 and over the first dielectric layer 158 and has a form such that the source electrode of the semiconductor die 154 154 is electrically coupled to the conductive material arranged in the slots 146 and to the portion of the metal 149 surrounding the slots 146. A further portion of the second conductive layer 162 extends between the control electrode 155 and the via 147. The portion 151 of the metal foil is also covered by a portion of the second conductive layer 162.

The second conductive layer 163 arranged on the lower surface 144 the dielectric core layer 140 includes a first portion 164 which extends from the second current electrode 148 to a first peripheral edge and includes four contact pads 165 at the peripheral edge. The second conductive layer 163 includes a second portion 166 arranged underneath the slots 146 and electrically coupled to the first current electrode 154 and a third portion 167 which is arranged underneath the via 147 and is electrically coupled with the control electrode 155. The portions 168, 167 are arranged at the opposing peripheral edge of the lower surface 144 of the dielectric core layer 140 and provide four contact pads 165. The conductive layers 162, 163 include copper that has been deposited using an electroplating process.

This second copper deposition creates the connection to the die contacts on the top surface of the assembly. The top contacts to the die are connected to the bottom contact pads. The slots 146 and via 147 receive copper maintaining the planarity across the die surface created by the first plating stage and further thickening the copper in the connection apertures, i.e. in the slots 146 and via 147.

On the bottom side of the assembly, the final customer contacts are created in this case the four contact pads for the gate and source connections and also the header area for the drain connection. The arrangement of the contact pads may conform to the lead-frame layout of a JEDEC package outline, such as a SSO8 package.

Figure 10A:
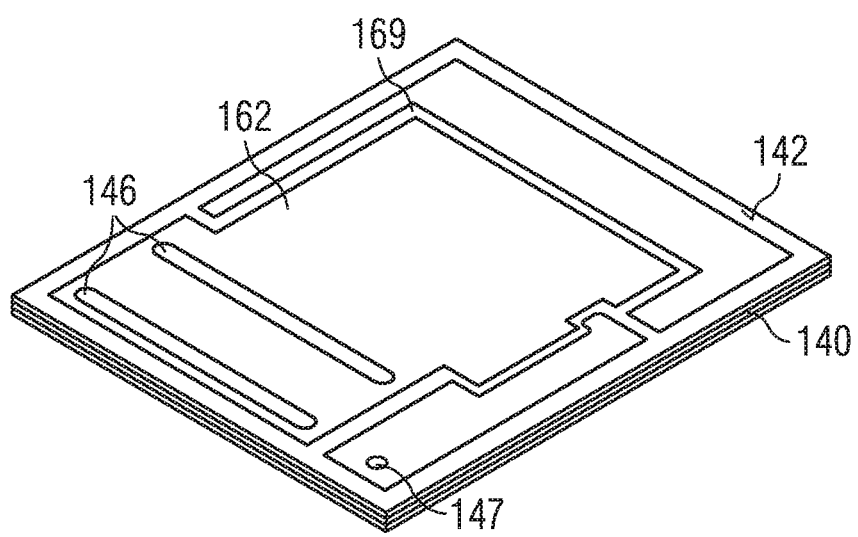
FIG. 10a illustrates a perspective view of a second dielectric layer arranged on the upper surface of the dielectric core layer.
Figure 10B:
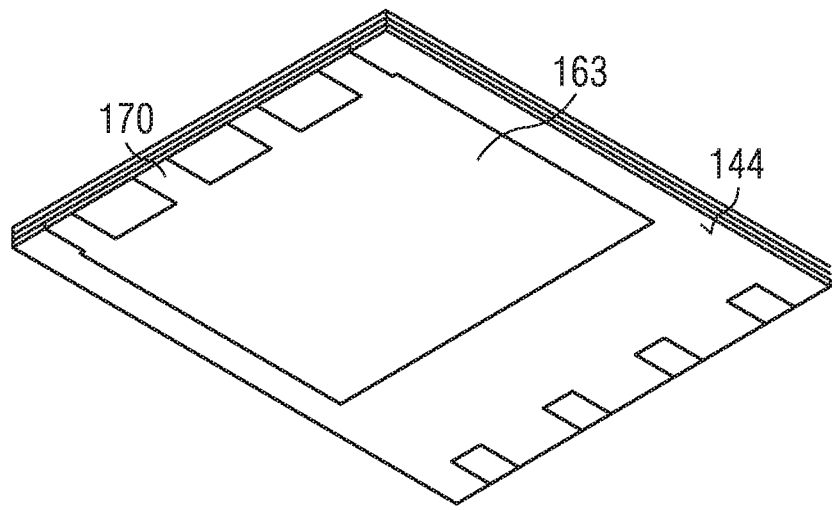
FIG. 10b illustrates a perspective view of a second dielectric layer arranged on the lower surface of the dielectric core layer.

FIG. 10a illustrates a second dielectric layer 169 arranged on the upper surface 142 of the dielectric core layer 140 and FIG. 10b illustrates a second dielectric layer 170 arranged on the lower surface 144 of the dielectric core layer 140.

The second dielectric layer 169 is arranged between portions of the second conductive layer 162 on the upper surface 142 of the dielectric core layer and the second dielectric layer 170 is arranged between portions of the second conductive layer 163 arranged on the lower surface 144 of the dielectric core layer 140. The second dielectric layers 169, 170 may be used as planarisation layers. In some embodiments, the contact pads 165, 168 arranged on the lower surface 144 of the dielectric core layer 140 may be raised above the conductive portions 166, 167, 163.

Dielectric material is again deposited to planarise the assembly. On the top surface of the assembly the gaps between tracks are filled and the apertures for the connections, i.e. the slots 146 and via 147, are filled. On the bottom surface of the assembly the dielectric fills in the areas between the contact pads 165 making the bottom surface substantially planar.

Figure 11:
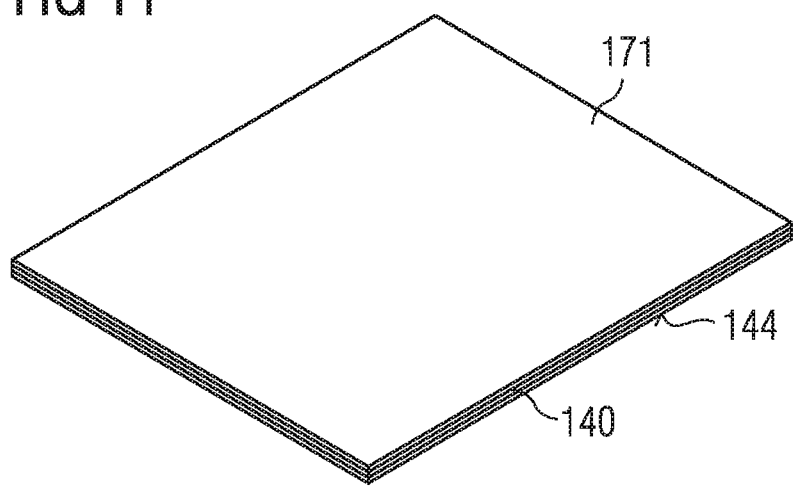
FIG. 11 illustrates a perspective view of the electronic component including an adhesive layer arranged on its upper surface.
Figure 12:
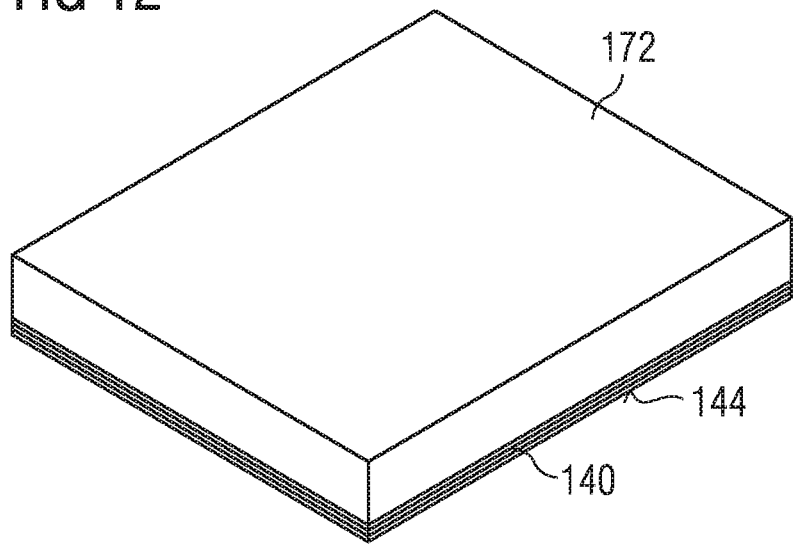
FIG. 12 illustrates perspective view of the electronic component including a heat dissipation layer arranged on the adhesive layer.

FIGS. 10a and 10b illustrates the electronic component in a form in which it may be used in applications. In some embodiments, it may be desirable to provide an additional heatsink which is mounted directly on the electronic component This may be done by applying a layer of adhesive 171 to the upper surface 142 as is illustrated in FIG. 11 and attaching a thermally conductive layer 172 to the adhesive as is illustrated in FIG. 12. The thermally conductive layer 172 may be substantially planar and may have a form lateral area corresponding to the lateral area of the electronic component. The thermally conductive layer 172 provides a heat dissipation layer and may include a metal such as copper or aluminium was has a substantially isotropic thermal conductivity.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures.

Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
a dielectric core layer having a first major surface and a second major surface that opposes the first major surface;
a semiconductor die comprising a first surface and a first electrode arranged on the first surface, wherein the semiconductor die is embedded in the dielectric core layer;
one or more slots extending through the dielectric core layer and arranged adjacent the semiconductor die, and
a redistribution structure electrically coupling the first electrode to a component contact pad arranged on the second major surface of the dielectric core layer,
wherein a portion of the redistribution structure is arranged on side walls of the slot.

2. The electronic component of claim 1, wherein the slot has a length $l_s$ and a width $w_s$, wherein $2 w_s \leq l_s \leq 20 w_s$.

3. The electronic component of claim 1, wherein two or more slots are arranged substantially parallel to one another.

4. The electronic component of claim 1, wherein conductive material is arranged in the two or more slots and electrically couples the first electrode to the component contact pad.

5. The electronic component of claim 1, wherein a portion of the redistribution structure is arranged on the first major surface of the dielectric core layer and on the first electrode.

6. The electronic component according to claim 1, wherein the dielectric core layer comprises reinforced material.

7. The electronic component according to claim 1, wherein the dielectric core layer comprises a fiber reinforced matrix.

8. The electronic component according to claim 1, wherein the dielectric core layer comprises one of the group consisting of PTFE, PEN, PET, BT and polyimide.

9. The electronic component according to claim 1, wherein the first dielectric core layer comprises an aperture and the semiconductor die is secured in the aperture by a layer of adhesive arranged between sidewalls defining the aperture and side faces of the semiconductor die.

10. The electronic component of claim 9, wherein the slot extends substantially parallel to a side face of the aperture.

11. The electronic component according to claim 1, wherein the slot has a length ls, and the component contact pad has a length lp, wherein $0.9\ lp < ls < 0.99\ lp$.

12. The electronic component according to claim 1, wherein the slot has an area $a_s$, the component contact pad has an area $a_p$, wherein $0.1\ a_p < a_s < 0.2\ a_p$.

13. The electronic component according to claim 1, further comprising a heat dissipation layer thermally coupled to the semiconductor die, the heat dissipation layer comprising a material having a substantially isotropic thermal conductivity.

14. The electronic component according to claim 13, further comprising a second dielectric core layer comprising an aperture, wherein the heat dissipation layer is arranged in the aperture in the second dielectric core layer.

15. The electronic component according to claim 14, wherein the heat dissipation layer is secured in the aperture by adhesive positioned between side faces of the heat dissipation layer and the walls defining the aperture.

16. The electronic component according to claim 1, further comprising at least one further semiconductor die.

17. The electronic component according to claim 16, wherein the semiconductor die comprises a transistor device and the further semiconductor die comprises one of the group consisting of a transistor device and a diode.

18. A method, comprising:
arranging a semiconductor die in an aperture in a dielectric core layer,
securing the semiconductor die in the aperture to embed the semiconductor die in the dielectric core layer, the semiconductor die comprising a first major surface, a first electrode arranged on the first major surface and a second major surface that opposes the first major surface,
arranging a portion of a redistribution structure on side walls of one or more slots arranged within the dielectric core layer adjacent the semiconductor die, and
electrically coupling the first electrode to a component contact pad arranged on the dielectric core layer adjacent the second major surface of the semiconductor die.

19. The method of claim 18, wherein the arranging a portion of the redistribution structure comprises arranging conductive material on the side walls and on a base of the slot, the base being formed by a metal foil covering the slot.

20. The method according to claim 18, wherein a first metallic foil is arranged on first major surface of the dielectric core layer, the first metallic foil having a first portion surrounding the one or more slots, a second portion surrounding a via and a third portion extending on remaining three sides of the aperture, wherein the first, second and third portions are electrically insulated from one another by intervening portions of the dielectric core layer, and wherein a second metallic foil is positioned on second major surface and having a pattern providing outer contact pads, the method further comprising:
applying a first dielectric layer on first surface of dielectric core layer;
applying a first conductive layer on the first major surface of the semiconductor die, the first dielectric layer and side faces of the slots;
applying a second conductive layer to electrically couple the first electrode to the conductive material arranged in the slot and to the first portion of the first metallic foil.

* * * * *

UNITED STATES PATENT AND TRADEMARK OFFICE
CERTIFICATE OF CORRECTION

PATENT NO. : 9,917,024 B2
APPLICATION NO. : 15/210752
DATED : March 13, 2018
INVENTOR(S) : M. Standing et al.

It is certified that error appears in the above-identified patent and that said Letters Patent is hereby corrected as shown below:

On the Title Page

Item (57) Abstract, Line 2, please change "one or semiconductor" to -- one or more semiconductor --

In the Claims

Column 17, Line 22 (Claim 11, Line 3) please change "<1s<" to -- $\leq 1s \leq$ --
Column 17, Line 25 (Claim 12, Line 3) please change "<as<" to -- $\leq as \leq$ --
Column 18, Line 24 (Claim 20, Line 2) please change "on first" to -- on a first --
Column 18, Line 31 (Claim 20, Line 9) please change "on second" to -- on a second --
Column 18, Line 34 (Claim 20, Line 12) please change "on first" to -- on a first --

Signed and Sealed this
Twenty-ninth Day of May, 2018

Andrei Iancu
*Director of the United States Patent and Trademark Office*